(12) United States Patent
Kinoshita

(10) Patent No.: US 8,937,843 B2
(45) Date of Patent: Jan. 20, 2015

(54) SEMICONDUCTOR DEVICE HAVING COUNTER CIRCUIT

(71) Applicant: PS4 Luxco S.a.r.l., Luxembourg (LU)

(72) Inventor: Hiroto Kinoshita, Tokyo (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 0 days.

(21) Appl. No.: 13/743,052

(22) Filed: Jan. 16, 2013

(65) Prior Publication Data

US 2013/0182516 A1    Jul. 18, 2013

(30) Foreign Application Priority Data

Jan. 18, 2012   (JP) .................................. 2012-008277

(51) Int. Cl.
| | |
|---|---|
| *G11C 7/00* | (2006.01) |
| *G11C 8/18* | (2006.01) |
| *G11C 11/4076* | (2006.01) |
| *G11C 7/22* | (2006.01) |

(52) U.S. Cl.
CPC .......... *G11C 8/18* (2013.01); *G11C 2207/2272* (2013.01); *G11C 11/4076* (2013.01); *G11C 7/222* (2013.01)
USPC ........................................ 365/194; 365/233.5

(58) Field of Classification Search
CPC ................................. G11C 7/222; G11C 7/22
USPC ............................................... 365/194, 233.5
See application file for complete search history.

(56) References Cited

U.S. PATENT DOCUMENTS

| | | | | |
|---|---|---|---|---|
| 7,343,473 | B2 * | 3/2008 | Coon et al. ..................... | 712/210 |
| 7,715,272 | B2 | 5/2010 | Kinoshita et al. | |
| 7,864,623 | B2 | 1/2011 | Kinoshita et al. | |
| 2002/0047137 | A1 * | 4/2002 | Arimoto et al. ................ | 257/213 |
| 2006/0129869 | A1 * | 6/2006 | Hendrickson et al. ......... | 713/503 |
| 2007/0297250 | A1 * | 12/2007 | Chae ......................... | 365/189.12 |

FOREIGN PATENT DOCUMENTS

JP          2010-3397 A       1/2010

* cited by examiner

*Primary Examiner* — Michael Tran
(74) *Attorney, Agent, or Firm* — Foley & Lardner LLP

(57) ABSTRACT

A semiconductor device is disclosed which comprises a clock generating circuit generating first and second divided clocks by dividing an input clock by first and second division number, respectively, and a counter circuit including a shift register having a plurality of stages that sequentially shifts an input signal and outputs an output signal delayed based on setting information. The counter circuit individually controls operation timings of the stages of the shift register by selectively supplying either of the first and second divided clocks to each stage of the shift register, and either of signals from the stages of the shift register is extracted and outputted as the output signal.

17 Claims, 9 Drawing Sheets

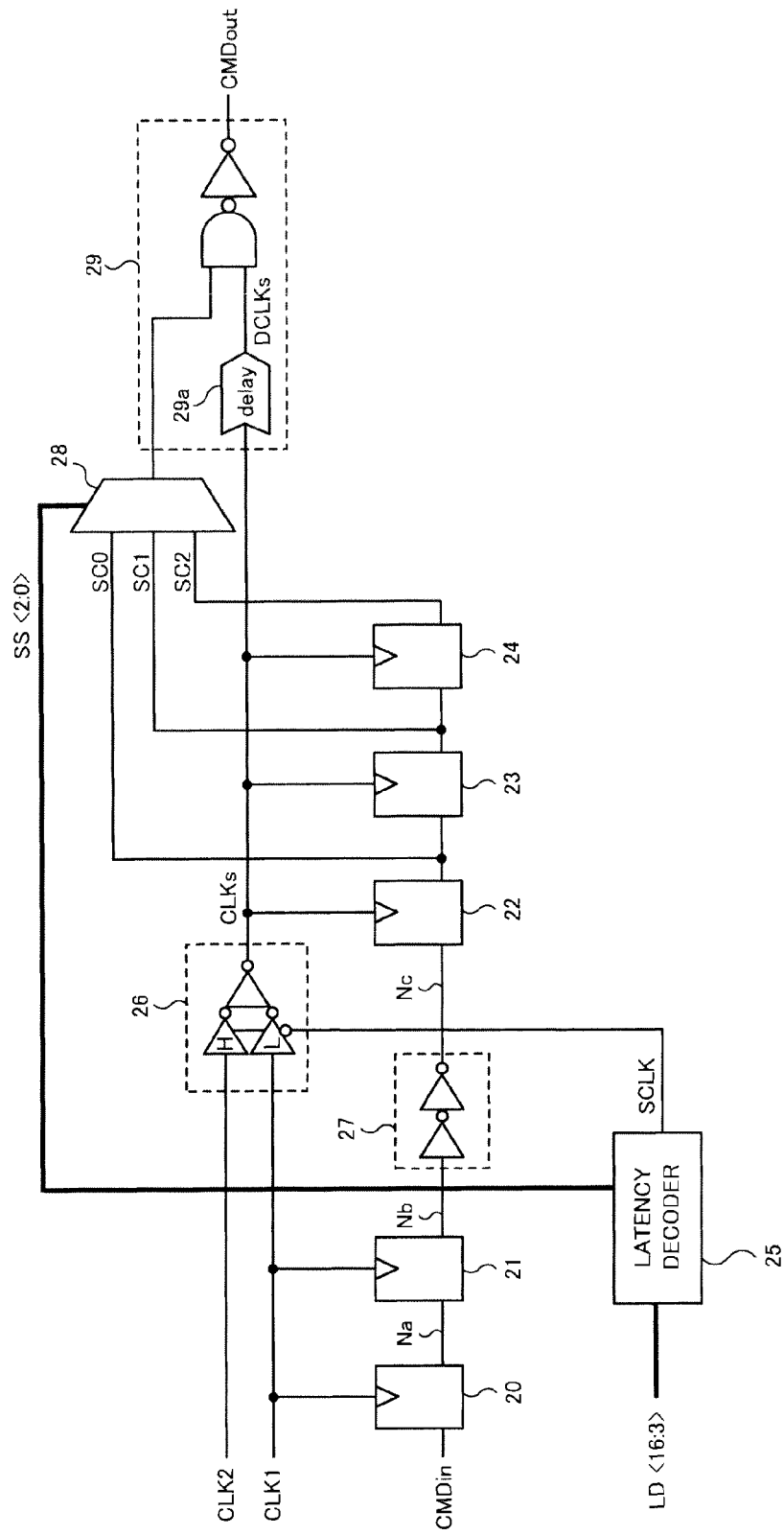

FIG. 3

SETTING CONDITIONS OF LATENCIES

| LATENCY | CLK1 | CLK2 | SCLK | SS <2:0> |
|---|---|---|---|---|
| 3 | DIVIDED BY 2 / 0th PHASE | DIVIDED BY 2 / FIRST PHASE | H | <0> |
| 4 | DIVIDED BY 2 / 0th PHASE | NOT USED | L | <0> |
| 5 | DIVIDED BY 4 / 0th PHASE | DIVIDED BY 4 / FIRST PHASE | H | <0> |
| 6 | DIVIDED BY 4 / 0th PHASE | DIVIDED BY 4 / SECOND PHASE | H | <0> |
| 7 | DIVIDED BY 4 / 0th PHASE | DIVIDED BY 4 / THIRD PHASE | H | <0> |
| 8 | DIVIDED BY 4 / 0th PHASE | NOT USED | L | <0> |
| 9 | DIVIDED BY 4 / 0th PHASE | DIVIDED BY 4 / FIRST PHASE | H | <1> |
| 10 | DIVIDED BY 4 / 0th PHASE | DIVIDED BY 4 / SECOND PHASE | H | <1> |
| 11 | DIVIDED BY 4 / 0th PHASE | DIVIDED BY 4 / THIRD PHASE | H | <1> |
| 12 | DIVIDED BY 4 / 0th PHASE | NOT USED | L | <1> |
| 13 | DIVIDED BY 4 / 0th PHASE | DIVIDED BY 4 / FIRST PHASE | H | <2> |
| 14 | DIVIDED BY 4 / 0th PHASE | DIVIDED BY 4 / SECOND PHASE | H | <2> |
| 15 | DIVIDED BY 4 / 0th PHASE | DIVIDED BY 4 / THIRD PHASE | H | <2> |
| 16 | DIVIDED BY 4 / 0th PHASE | NOT USED | L | <2> |

FIG. 8

| LATENCY | TRANSITION OF THE NUMBER OF CLOCK CYCLES | |
| --- | --- | --- |
| | EMBODIMENT | COMPARISON EXAMPLE |
| 3 | 2 + 1 | 2 + 1 |
| 4 | 2 + 2 | 2 + 2 |
| 5 | 4 + 1 | 2 + 1 + 2 |
| 6 | 4 + 2 | 2 + 2 + 2 |
| 7 | 4 + 3 | 2 + 2 + 1 + 2 |
| 8 | 4 + 4 | 2 + 2 + 2 + 2 |
| 9 | 4 + 1 + 4 | 2 + 2 + 1 + 2 + 2 |
| 10 | 4 + 2 + 4 | 2 + 2 + 2 + 2 + 2 |
| 11 | 4 + 3 + 4 | 2 + 2 + 1 + 2 + 2 + 2 |
| 12 | 4 + 4 + 4 | 2 + 2 + 2 + 2 + 2 + 2 |
| 13 | 4 + 1 + 4 + 4 | 2 + 2 + 1 + 2 + 2 + 2 + 2 |
| 14 | 4 + 2 + 4 + 4 | 2 + 2 + 2 + 2 + 2 + 2 + 2 |
| 15 | 4 + 3 + 4 + 4 | NOT USED |
| 16 | 4 + 4 + 4 + 4 | NOT USED |

<TRANSITION IN THE NUMBER OF CLOCK CYCLES IN THE EMBODIMENT>

$\underline{a1+a2+a2+a3}$ a1: THE NUMBER OF CYCLES COUNTED BY THE FLIP-FLOP 21 a2: THE NUMBER OF CYCLES COUNTED BY THE FLIP-FLOP 22 a3: THE NUMBER OF CYCLES COUNTED BY THE FLIP-FLOP 23 a4: THE NUMBER OF CYCLES COUNTED BY THE FLIP-FLOP 24

SEMICONDUCTOR DEVICE HAVING COUNTER CIRCUIT

This application claims priority to Japanese patent application no. 2012-008277, filed Jan. 18, 2012, the entire contents of which is incorporated herein by reference.

BACKGROUND OF THE INVENTION

1. Field of the Invention

The present invention relates to a semiconductor device operating in synchronization with a clock, and particularly relates to a semiconductor device configured to control operation timings in accordance with latencies.

2. Description of Related Art

In recent years, synchronous semiconductor memory devices operating in synchronization with a clock have been advanced to operate at a higher speed. For example, since extremely high data transfer rate is required in DRAM represented by DDR3-SDRAM (Double Data Rate 3 Synchronous Dynamic Random Access Memory), complication in circuit configuration and an increase in consumption current have become problems to be solved. This type of DRAM is provided with a latency counter circuit that counts the number of clock cycles as a latency from command issue to completion of data transfer during an operation. The latency counter circuit corresponding to a latency specification is required to include as a small number of circuit elements as possible and to be capable of operating with as small consumption current as possible. For example, Patent Reference 1 discloses a latency counter circuit having a configuration in which a command signal is sequentially latched using a clock obtained by dividing an external clock by two and a transmission path of the command signal can be selectively controlled in accordance with a preset latency for the purpose of counting the latency. By employing such a configuration, it is possible to achieve a latency counter circuit capable of obtaining operating margin when counting a user-set desired latency with a high speed.

[Patent Reference 1] Japanese Patent Application Laid-open No. 2010-3397 (U.S. Pat. Nos. 7,715,272 and 7,864,623)

However, specifications of DDR3-SDRAM prescribe, for example, a CAS latency that takes values of a wide range from 5 clock cycles to 16 clock cycles. In order to count the latency of such a wide range, many flip-flops need to be implemented in the latency counter circuit. Further, since a command signal is transmitted through the many flip-flops, particularly when counting a large latency during a high-speed operation, an increase in charge/discharge currents for operating a high-speed clock is inevitable. The latency counter circuit in this case has a problem that it receives double penalties of an increase in circuit scale required for the operation and an increase in consumption current required during the high-speed operation. Further, there are a wide variety of latencies to be counted corresponding to operation modes in the DRAM other than the CAS latency, and therefore the circuit scale and the consumption current remarkably increase when providing latency counters corresponding to the respective latencies.

SUMMARY

A semiconductor device according to an embodiment of the disclosure comprises: a clock generating circuit capable of generating a first divided clock including a first phase by dividing an input clock by a first division number and a second divided clock including second phase by dividing the input clock by a second division number, respectively, based on setting information; and a counter circuit including a shift register which includes a plurality of stages that sequentially shifts an input signal and outputs an output signal delayed based on the setting information, wherein the counter circuit is capable of individually controlling operation timings of respective stages of the shift register by selectively supplying either of the first and second divided clocks to the stages of the shift register and is capable of extracting either of signals outputted from the stages of the shift register to output it as the output signal, based on the setting information.

When counting a set latency, the semiconductor device of the invention controls both the division numbers and phase relation of the input clock so as to generate the first and second divided clocks each having individual division number and phase, controls operation timings of respective stages of the shift register shifting the input signal by using the first and second divided clocks, and selectively outputs each of signals from the stages of the shift register as the output signal. Thus, it is possible to control latencies within a wide range in accordance with the division numbers and to finely adjust the latencies in accordance with the phase relation, respectively, by using the first and second divided clocks. Further, it is possible to freely control paths to extract the output signal by shifting the input signal. Accordingly, a desired latency can be counted without increasing the number of stages of the shift register, and charge/discharge currents in operating the high-speed clock can be reduced.

BRIEF DESCRIPTION OF THE DRAWINGS

FIG. 2 is a diagram showing a configuration example of a latency counter circuit 12 of FIG. 1;

FIG. 3 is a table showing an example of setting conditions for counting latencies 3 to 16 in the latency counter circuit 12, including setting conditions of division numbers and phase relations of divided clocks CLK1 and CLK2, a clock control signal SCLK and a selection signal SS<2:0>;

FIG. 8 is a table for explaining a transition of the number of clock cycles required in an operation of the latency counter circuit 12.

DETAILED DESCRIPTION OF THE PREFERRED EMBODIMENTS

Figure 1:
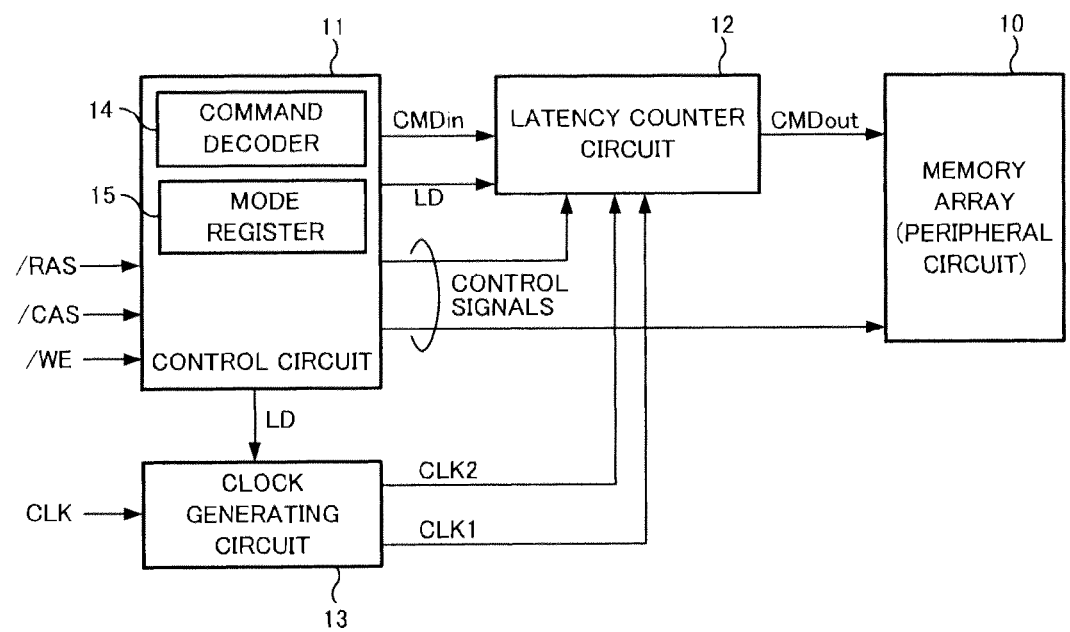
FIG. 1 is a block diagram showing a primary configuration of a semiconductor device of an embodiment.

Embodiments of the present invention will be described in detail below with reference to accompanying drawings. In the following embodiments, the present invention will be applied to a semiconductor device operating in synchronization with an external clock. An example of the semiconductor device is, for example, DDR3-SDRAM (Double Data Rate 3 Synchronous Dynamic Random Access Memory) that includes a latency counter circuit for counting latencies defined corresponding to various commands. FIG. 1 is a block diagram showing a primary configuration of a semiconductor device of an embodiment. The semiconductor device shown in FIG. 1 comprises a memory array 10, a control circuit 11, a latency counter circuit 12, and a clock generating circuit 13. Further, a command decoder 14 and a mode register 15 are included in the control circuit 11. Although the semiconductor device actually includes many other elements, FIG. 1 shows only elements associated with the function of the invention.

In the above configuration, the memory array 10 includes a plurality of memory cells formed at intersections of a plurality of word lines and a plurality of bit lines that are arranged in a matrix form, and a read or write operation is performed for a memory cell corresponding to a designated address. The memory array 10 is attached with a peripheral circuit required for selecting a word line and a bit line. The control circuit 11 controls operations of the semiconductor device of the embodiment as a whole, and sends control signals to various parts. The control circuit 11 receives external commands, each of which is decoded by the command decoder 14, and outputs an input command signal CMDin in accordance with a command type. The mode register 15 in the control circuit 11 has a function to store operation modes that can be set for the semiconductor device. Information for designating latencies corresponding to operations of the semiconductor device is previously stored in the mode register 15 by a predetermined external command. Here, the external commands are defined based on combinations of various control signals (a row address strobe signal /RAS, a column address strobe signal /CAS and a write enable signal /WE) that are inputted to the control circuit 11 from outside.

The clock generating circuit 13 receives an external clock CLK and generates a divided clock CLK1 (the first divided clock) and a divided clock CLK2 (the second divided clock), respectively, which are two types of divided clocks each obtained by dividing the external clock CLK by two or four. The clock generating circuit 13 can selectively generate the divided clocks CLK1 and CLK2 each having any of a plurality of phases on the basis of the phase of the external clock CLK. The divided clocks CLK1 and CLK2 each having a division number and a phase that are individually selected based on latency data LD, which is sent from the mode register 15 of the control circuit 11, are supplied from the clock generating circuit 13 to the latency counter circuit 12. Here, the configuration and operation of the clock generating circuit 13 will be described in detail later.

In the semiconductor device of the embodiment, the latency counter circuit 12 is a circuit that counts an arbitrary latency within a range of a predetermined number of clock cycles of the external clock CLK by using the divided clocks CLK1 and CLK2. The latency counter circuit 12 receives the input command signal CMDin from the command decoder 14 of the control circuit 11, and generates an output command signal CMDout given with a latency by counting a desired number of clock cycles using the divided clocks CLK1 and CLK2. The operation of the latency counter circuit 12 is controlled by the latency data LD sent from the mode register 15 of the control circuit 11. Specific configuration and operation of the latency counter circuit 12 will be described later.

In the latency counter circuit 12, for example, latencies that can be counted based on the specifications of DDR3-SDRAM include a CAS latency CL defined as the number of clock cycles from issuing a read command to reading read data, a CAS write latency CWL defined as the number of clock cycles from issuing a write command to writing write data, an additive latency AL defined as the number of clock cycles until an input read/write command becomes valid, and the like. In order to count these latencies, latency counter circuits 12 corresponding to the respective latencies need to be provided. Further, two or more latency counter circuits 12 may be connected in cascade so as to count a latency obtained by adding two or more different latencies. For example, it is possible to achieve a configuration for counting a read latency (RL=AL+CL) obtained by connecting a latency counter circuit 12 for the CAS latency (CL) and a latency counter circuit 12 for the additive latency (AL) in cascade.

Next, a specific configuration of the latency counter circuit 12 of an embodiment will be described. FIG. 2 show a configuration example of the latency counter circuit 12 of FIG. 1. Hereinafter, an example of the latency counter circuit 12 capable of arbitrarily counting 14 latencies 3 to 16 within a range from the minimum latency 3 to the maximum latency 16 will be described. The latency counter circuit 12 shown in FIG. 2 includes five flip-flops (F/F) 20 to 24, a latency decoder 25, a clock selector 26, a buffer unit 27, an output selector 28, and an output circuit 29.

In the configuration of FIG. 2, the five flip-flops 20 to 24 are master-slave D-type flip-flops that form a five-stage shift register. The first stage flip-flop 20 receives the input command signal CMDin from the control circuit 11. An output node Na of the flip-flop 20 is connected to an input terminal of the second stage flip-flop 21. An output node Nb of the flip-flop 21 is connected to an input side of the buffer unit 27 that includes two-stage inverters. The divided clock CLK1 is supplied from the clock generating circuit 13 to respective clock terminals of the first and second stage flip-flops 20 and 21. Further, a pair of divided clocks CLK1 and CLK2 are supplied from the clock generating circuit 13 to the clock selector 26.

The latency decoder 25 receives 14-bit latency data LD<16:3> sent from the control circuit 11. One bit of the latency data LD<16:3>, which is corresponding to an arbitrary latency value set in the mode register 15, is activated The latency decoder 25 decodes the activated bit of the latency data LD<16:3>, and generates a 3-bit selection signal SS<2:0> and a clock control signal SCLK, respectively, in response to a decode result. The selection signal SS<2:0> is supplied to the output selector 28. In the latency counter circuit 12 of this embodiment, a transmission path of the input command signal CMDin and supply paths of the divided clocks CLK1 and CLK2 are controlled depending on decoding rules in the latency decoder 25, which will be described in detail later.

The clock selector 26 including three inverters receives one divided clock CLK1 and the other divided clock CLK2, respectively, and selects either of the divided clocks CLK1 and CLK2 based on the above clock control signal SCLK so as to output it as a selected clock CLKs. Meanwhile, an output node No of the buffer unit 27 is connected to an input terminal of the third stage flip-flop 22. Then, the third, fourth and fifth stage flip-flops 22, 23 and 24 are connected in cascade in this order, and output selected command signals SC0, SC1 and SC2 sequentially from respective output terminals. By this connection, it is understood that the five flip-flops 20 to 24 function as a five-stage shift register that shifts the input command signal CMDin sequentially. In addition, the buffer unit 27 inserted between the second and third stage flip-flops 21 and 22 has a function to adjust a margin for changing the clock for the input command signal CMDin from the divided clock CLK1 to the divided clock CLK2. The above selected clock CLKs outputted from the clock selector 26 is supplied to respective clock terminals of the third, fourth and fifth stage flip-flops 22, 23 and 24.

The output selector 28 selects and outputs either one of the selected command signals SC0, SC1 and SC2 based on the selection signal SS<2:0> supplied from the latency decoder 25. The output circuit 29 takes a logical product between a delayed selected clock DCLKs obtained by delaying the selected clock CLKs through a delay element 29a by a predetermined time and the one of the selected command signals SC0, SC1 and SC2 selected by the output selector 28, and outputs it as the output command signal CMDout. The predetermined time that is delayed by the delay element 29a is set to a value such that an overlap margin required for the logical operation in the output circuit 29 can be obtained. The output command signal CMDout outputted from the output circuit 29 is obtained by delaying the input command signal CMDin by a desired latency within a range of the latencies 3 to 16 designated by the latency data LD<16:3>. In this manner, the output selector 28 has a function of selecting a path appropriate for the latency, which will be described in detail later.

Next, a specific operation of the latency counter circuit 12 of FIG. 2 will be described with reference to FIGS. 3 to 7. FIG. 3 is a table showing an example of setting conditions for counting the latencies 3 to 16 in the latency counter circuit 12 of FIG. 2, including setting conditions of division numbers and phase relations of the divided clocks CLK1 and CLK2, the clock control signal SCLK and the selection signal SS<2:0>. As shown in FIG. 3, there are six combinations of the divided clocks CLK1 and CLK2 in accordance with the division numbers and phase relations, which are selectively generated by the clock generating circuit 13. That is, the divided clock CLK1 is set to either of two patterns including "divided by 2 and zeroth phase" and "divided by 4 and zeroth phase", the divided clock CLK2 is set to either of four patterns including "divided by 2 and first phase", "divided by 4 and first phase", "divided by 4 and second phase" and "divided by 4 and third phase". Further, the clock control signal SCLK is set to two patterns including "High" (H) and "Low" (L), and the selection signal SS<2:0> is set to three patterns including <0>, <1> and <2>. In addition, the divided clock CLK2 is not used when the clock control signal SCLK is Low.

Figure 4:
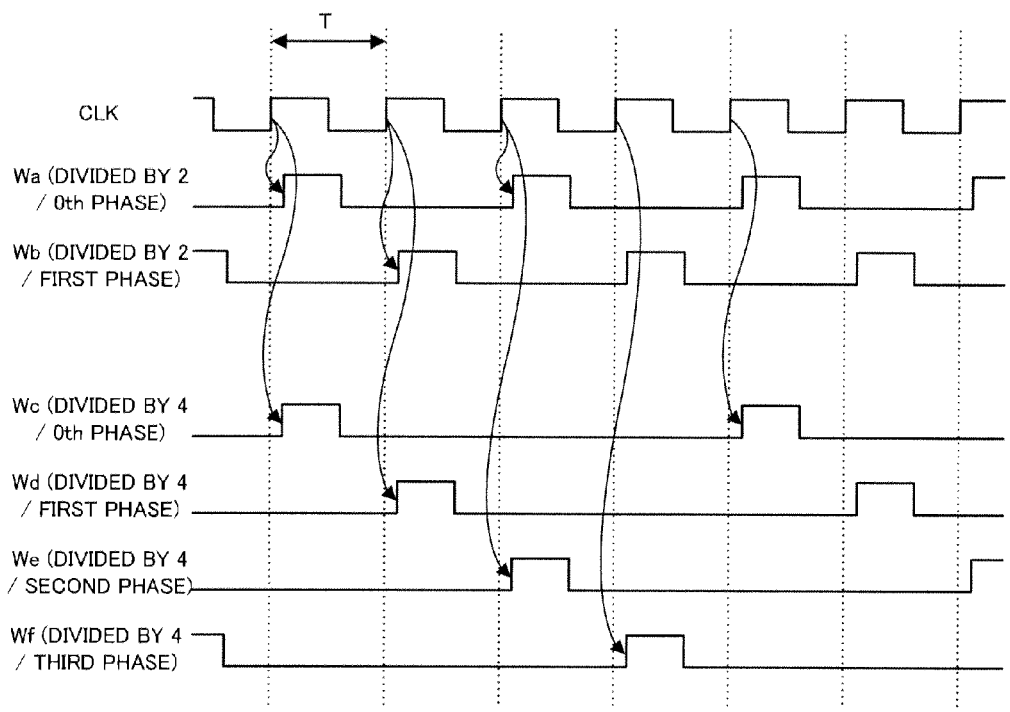
FIG. 4 is a diagram showing six waveforms generated in a clock generating circuit 13 regarding the setting conditions of the divided clocks CLK1 and CLK2 of FIG. 3.

FIG. 4 shows six waveforms generated in the clock generating circuit 13 regarding the setting conditions of the divided clocks CLK1 and CLK2 of FIG. 3. That is, six waveforms Wa, Wb, Wc, Wd, We and Wf are generated by dividing the external clock CLK having a predetermined period T in synchronization with its rising edges. Among these, the waveforms We and Wb have a period 2T and phases different from each other by 180 degrees (zeroth and first phases), and the waveform Wc, Wd, We and Wf have a period of 4T and phases different from one another by 90 degrees (zeroth to third phases). In addition, each of the waveforms Na to Wf has a pulse width T/2, similarly as the external clock CLK.

Figure 5:
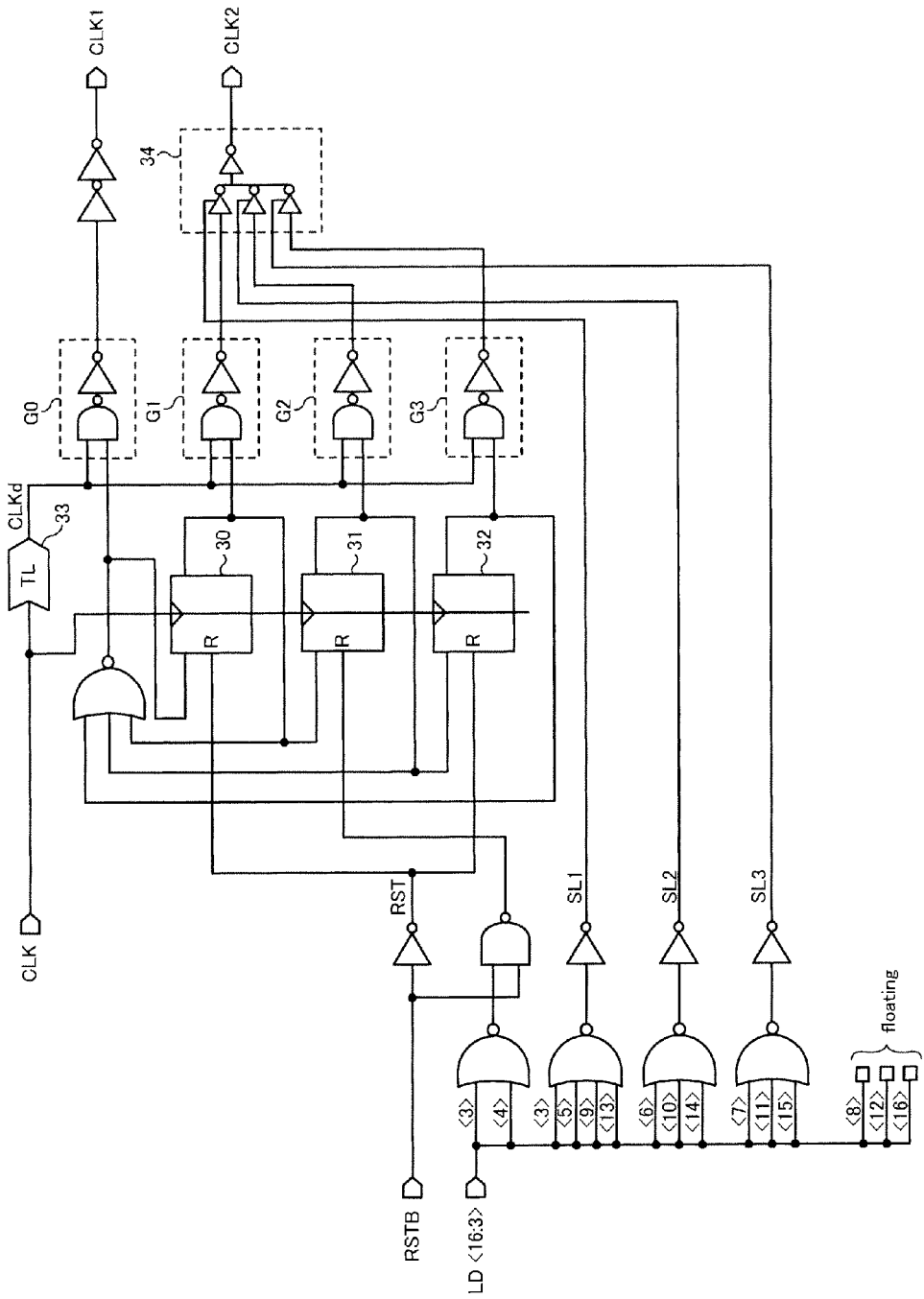
FIG. 5 is a diagram showing a configuration example of the clock generating circuit 13 of FIG. 1.

Further, FIG. 5 shows a configuration example of the clock generating circuit 13 (FIG. 1) that generates the divided clocks CLK1 and CLK2. As shown in FIG. 5, the clock generating circuit 13 receives the external clock CLK, a reset signal RSTB and the latency data LD<16:3>, and outputs the divided clocks CLK1 and CLK2 each having any of the waveforms Na to Wf of FIG. 4. The clock generating circuit 13 includes three flip-flops 30, 31 and 32, a delay element 33, gate circuits G0, G1, G2 and G3, a selector 34, and many other logic elements. The flip-flops 30 to 32 are connected in cascade in three stages, each of which has a reset terminal(R) in addition to an input terminal, an output terminal and a clock terminal. A reset signal RST (an inverted signal of a reset signal RSTB) and the latency data<16:3> are supplied to the respective reset terminals(R) through the logic elements.

As shown in FIG. 5, the 14-bit latency data LD<16:3> can be divided into five groups. That is, in association with the table of FIG. 3, the five groups of latencies correspond to latencies 3 and 4 for which the divided clocks CLK1 and CLK2 are set to "divided by 2", latencies 3, 5, 9 and 13 for which the divided clock CLK2 is set to "divided by 2 (first phase)" or "divided by 4 (first phase)", latencies 6, 10 and 14 for which the divided clock CLK2 is set to "divided by 4 (second phase)" latencies 7, 11 and 15 for which the divided clock CLK2 is set to "divided by 4 (third phase)" and latencies 8, 12 and 16 for which the divided clock CLK2 is not used. Among these groups, data lines for the latencies 8, 12 and 16 are in a floating state, and other data lines are connected to NOR gates corresponding to the respective groups. Further, outputs of the NOR gates corresponding to the first, second and third phases of the above divided clock CLK2 are supplied as three selection signals SL1, SL2 and SL3 to the selector 34 via respective inverters.

The external clock CLK is supplied to respective clock terminals of the three flip-flops 30, 31 and 32. Further, the delay element 33 outputs a delayed clock CLKd obtained by delaying the external clock CLK by a time TL. The delayed clock CLKd is inputted to the four gate circuits G0, G1, G2 and G3. Among these, an output of the gate circuit G0 shown in the upper side is outputted as the divided clock CLK1 (zeroth phase), and outputs of the three gate circuits G1, G2 and G3 are inputted to the above selector 34 as signals of the first, second and third phases (waveforms Wd, We and Wf of FIG. 4) of the divided clock CLK2. Among the divided clocks (first, second and third phases) inputted to the selector 34 corresponding to the divided clock CLK2, a divided clock selected based on the selection signals SL1, SL2 and SL3 is outputted as the selected divided clock CLK2.

Hereinafter, a specific operation of the clock generating circuit 13 of FIG. 5 will be described. When the latency 3 is set, a path for the group of the latency data LD<3><4> of FIG. 5 is activated, and the reset terminal (R) of the flip-flop 31 is enabled (High). Thus, an output of the flip-flop 31 is fixed to Low, and an output of the subsequent flip-flop 32 is fixed to Low at the same time. As a result, the flip-flop 30 operates as a divide-by-two counter, and a divide-by-two clock obtained from the external clock CLK (FIG. 4) is latched by the flip-flop 31, which is outputted as the divided clock CLK1 (divided by 2/zeroth phase) through the gate circuit G0. Further, a divide-by-two clock (first phase) delayed by the period T from the divided clock CLK1 is generated via the flip-flop 30, which is outputted as the divided clock CLK2 (divided by 2/first phase) through the gate circuit G1 and the selector 34.

Meanwhile, when either one of the latencies 5, 9 and 13 is set, a path for the group of the latency data LD<5><9><13> of FIG. 5 is activated, and reset terminals (R) of the respective flip-flops 30, 31 and 32 are disabled (Low) so as to operate as a divide-by-4 counter. Thus, the gate circuits G0, G1, G2 and G3 receive four divided clocks whose phases are delayed by the period T from one another, respectively. Thus, the divided clock CLK1 (divided by 4/zeroth phase) is outputted through the gate circuit G0, and the selection signal SL1 is supplied to the selector 34 through the path for the group of the latency data LD<5><9><13>, and therefore the divided clock CLK2 (divided by 4/first phase) is outputted through the gate circuit G1 and the selector 34. In this case, the clock generating circuit 13 operates in the same manner for all the latencies 5, 9 and 13 corresponding to the table of FIG. 3.

Figure 6:
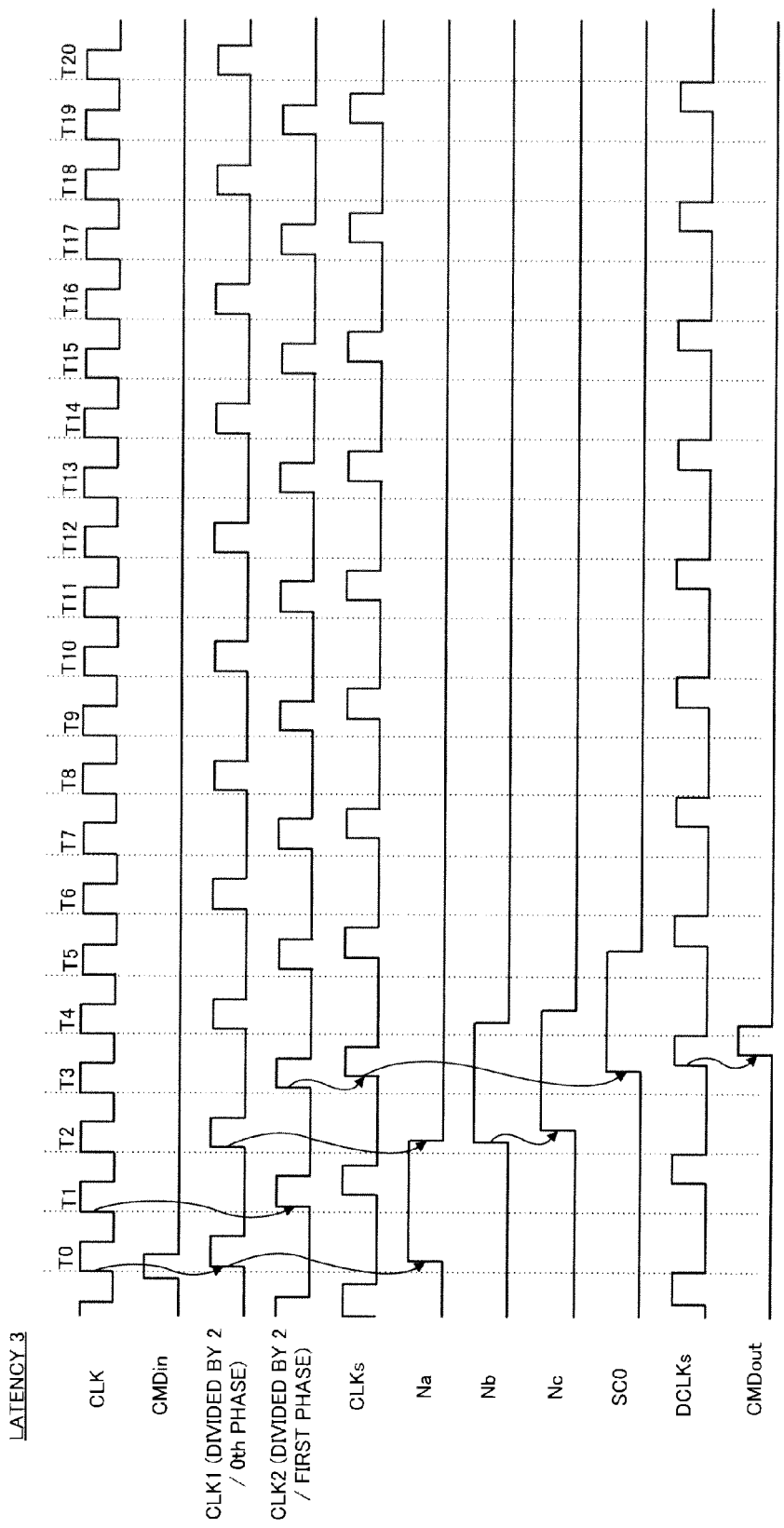
FIG. 6 is a diagram showing an example of operation waveforms obtained when counting the minimum latency 3 in the latency counter circuit 12.

Next, operations of the latency counter circuit 12 of FIG. 2 will be described using FIGS. 6 and 7. FIG. 6 shows an example of operation waveforms obtained when counting the minimum latency 3. In the uppermost part of FIG. 6, the external clock CLK having the period T is indicated within a range between cycles T0 to T20. The setting condition for the latency 3 is assumed to be the divided clock CLK1 (divided by 2/zeroth phase), the divided clock CLK2 (divided by 2/first phase), the clock control signal SCLK=H, and the selection signal SS<2:0>=<0>, as described using the table of FIG. 3. Accordingly, the clock generating circuit 13 generates the divided clock CLK1 having the waveform Wa (divided by 2/zeroth phase) of FIG. 4 and the divided clock CLK2 having the waveform Wb (divided by 2/first phase) of FIG. 4.

In FIG. 6, the input command signal CMDin is inputted at the cycle T0 first, and its pulse is latched in the first stage flip-flop 20 in synchronization with the rising edge of the divided clock CLK1. Thus, a pulse having a pulse width 2T equivalent to one period of the divided clock CLK1 is outputted to the node Na by the flip-flop 20. Further, a pulse having the pulse width 2T that rises simultaneously with falling of the pulse at the node Na is outputted to the node Nb through the node Na and the second stage flip-flop 21. Furthermore, the pulse at the node Nb is slightly delayed and outputted via the buffer unit 27 to the node Nc.

Meanwhile, the clock selector 26 is in a state where the divided clock CLK2 is selected by the clock control signal SCLK that is set to High. Thus, the pulse at the node Nc is latched in the third stage flip-flop 22 in synchronization with the rising edge of the divided clock CLK2. The flip-flop 22 outputs a pulse having a period 2T that rises at the cycle T3 as the selected command signal SC0. The output command signal CMDout having a pulse width T/2 that rises at the cycle T3 is outputted by the output selector 28 and the output circuit 29 based on the selection signal SS<0> by using the delayed selected clock DCLKs obtained by slightly delaying the selected clock CLKs. In this manner, it is possible to obtain the output command signal CMDout by adding a delay time equivalent to the latency 3 to the input command signal CMDin.

Figure 7:
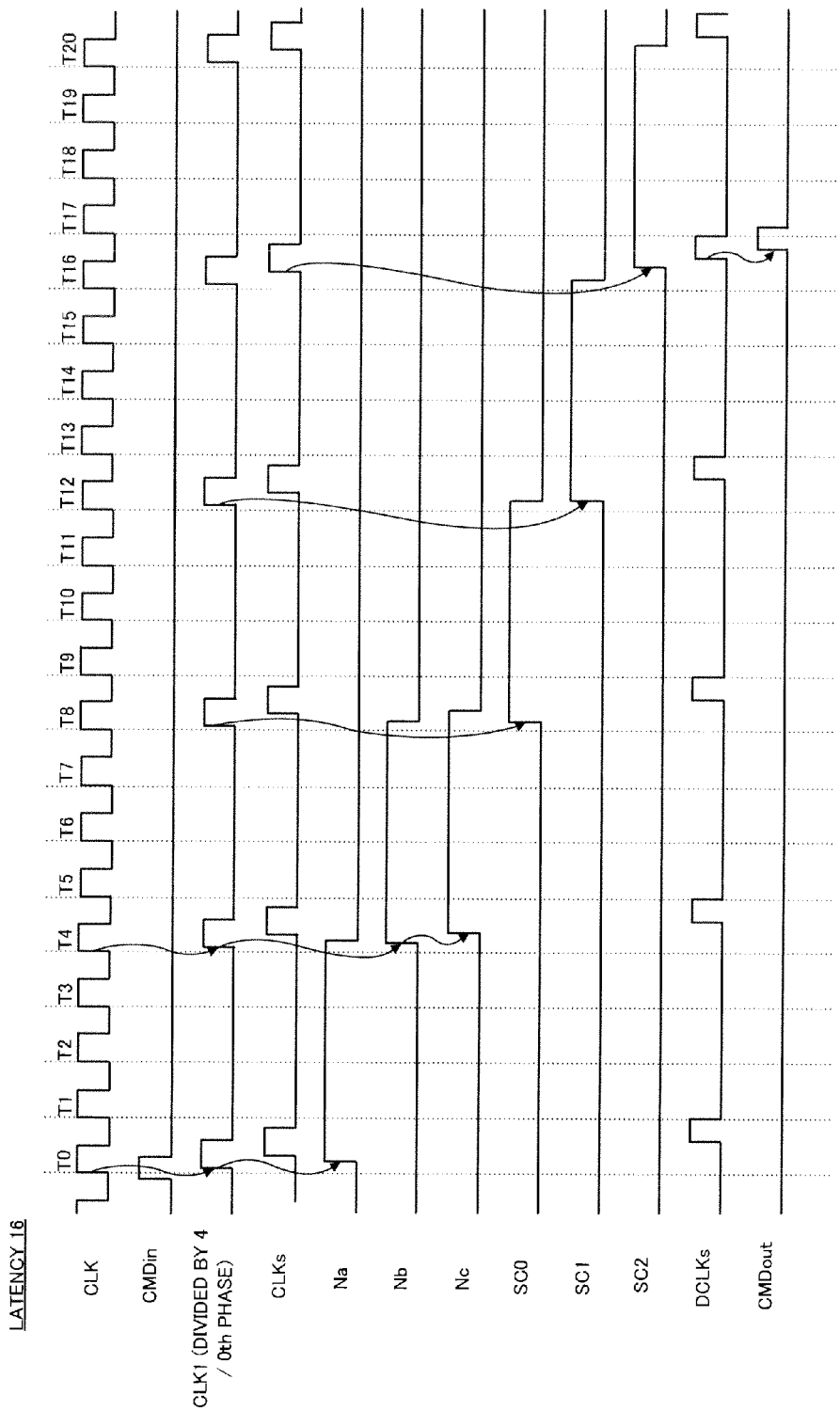
FIG. 7 is a diagram showing an example of operation waveforms obtained when counting the maximum latency 16 in the latency counter circuit 12.

Next, FIG. 7 shows an example of operation waveforms obtained when counting the maximum latency 16. In FIG. 7, the external clock CLK is represented in the same manner as in FIG. 6. The setting condition for the latency 16 is assumed to be the divided clock CLK1 (divided by 4/zeroth phase), the clock control signal SCLK=L, and the selection signal SS<2:0>=<2>, as described using the table of FIG. 3. Accordingly, the clock generating circuit 13 generates the divided clock CLK1 having the waveform Wc (divided by 4/zeroth phase) of FIG. 4, while the divided clock CLK2 is not used.

In FIG. 7, the input command signal CMDin has the same waveform as in FIG. 6, and its pulse is latched in the first stage flip-flop 20 in synchronization with the rising edge of the divided clock CLK1. Thus, a pulse having a pulse width 4T equivalent to one period of the divided clock CLK1 is outputted to the node Na by the flip-flop 20. Further, a pulse having the pulse width 4T that rises simultaneously with falling of the pulse at the node Na is outputted to the node Nb through the node Na and the second stage flip-flop 21. Furthermore, the pulse at the node Nb is slightly delayed and outputted via the buffer unit 27 to the node Nc.

Meanwhile, the clock selector 26 is in a state where the divided clock CLK1 is selected by the clock control signal SCLK that is set to Low. Thus, the pulse at the node Nc is latched in the third stage flip-flop 22 in synchronization with the rising edge of the divided clock CLK1. The flip-flop 24 outputs a pulse having a period 4T that rises at the cycle 116 as the selected command signal SC2. The output command signal CMDout having a pulse width T/2 that rises at the cycle T16 is outputted by the output selector 28 and the output circuit 29 based on the selection signal SS<2> by using the delayed selected clock DCLKs obtained by slightly delaying the selected clock CLKs. In this manner, it is possible to obtain the output command signal CMDout by adding a delay time equivalent to the latency 16 to the input command signal CMDin.

Figure 9:
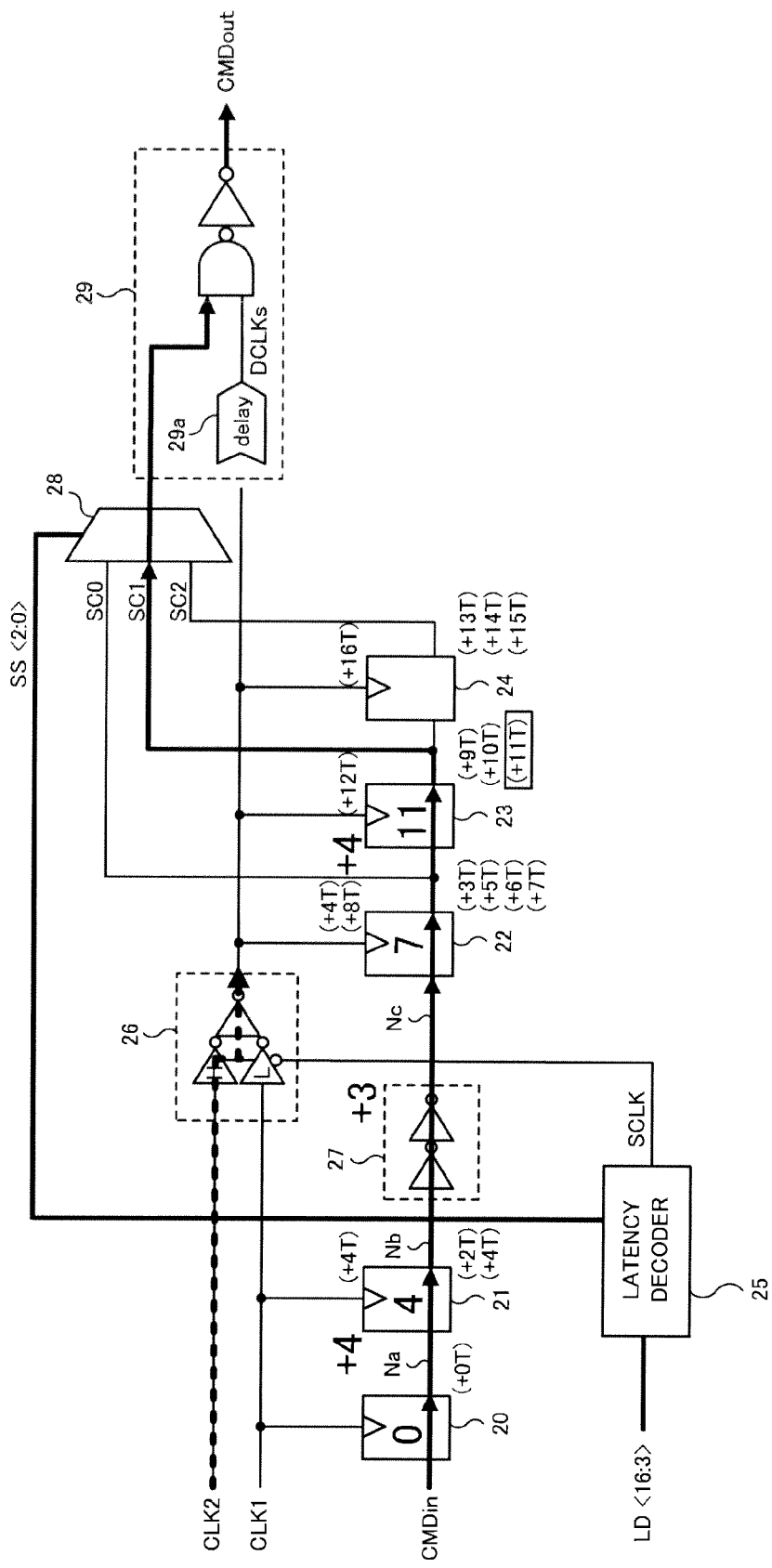
FIG. 9 is a diagram showing a transmission path and clock supply paths in the latency counter circuit 12 of FIG. 2 when counting a latency 11.

Next, effects obtained by using the latency counter circuit 12 of the embodiments will be described using FIGS. 8 and 9. FIG. 8 shows a table for explaining a transition of the number of clock cycles required in an operation of the latency counter circuit 12 when counting each of the 14 latencies 3 to 16. Further, FIG. 9 is a diagram showing a transmission path and clock supply paths in the latency counter circuit 12 of FIG. 2 when counting the latency 11 for the purpose of explaining the meaning of FIG. 8. In comparison with the embodiments, FIG. 8 shows a transition of the number of clock cycles in case of using the latency counter circuit disclosed in Patent Reference 1 as a comparison example including a conventional configuration.

In FIG. 8, it is assumed that the supply paths of the divided clocks CLK1 and CLK2 and the transmission path of the input command signal CMDin are set in accordance with the setting conditions of the table of FIG. 3 within the range of the latencies 3 to 16. In this case, a sum of the respective numbers of clock cycles (delay times) of the flip-flops 20 to 24 included in the transmission path of the input command signal CMDin is equal to a latency given to the output command signal CMDout. For example, an operation for the latency 11 of FIG. 8 will be described with reference to FIG. 9. FIG. 9 shows the transmission path (solid line) of the input command CMDin and the supply path (dashed line) of the divided clock CLK2 that are added to the configuration of the latency counter circuit 12 of FIG. 2, in which the transition of the number of clock cycles along the transmission path is additionally indicated.

The divided clock CLK1 is set to "divided by 4 and zeroth phase" and the divided clock CLK2 is set to "divided by 4 and third phase", respectively, for the latency 11, as shown in FIG. 3. Thus, in FIG. 9, the input command signal CMDin is latched in the first stage flip-flop 20 in synchronization with the divided clock CLK1, and after a lapse of 4 cycles, it is latched in the second stage flip-flop 21. Furthermore, the divided clock CLK2 delayed by 3 cycles (third phase) relative to the divided clock CLK1 is thereafter supplied to the flip-flops 22, 23 and 24. Therefore, after the divided clock CLK2 is latched in third stage flip-flop 22 after a lapse of 3 cycles (7 cycles in total), it is latched in the fourth stage flip-flop 23 after a lapse of 4 cycles (11 cycles in total). Since the selection signal SS<1> is set for the latency 11 (FIG. 3), the selected command signal SC1 obtained by delaying the input command signal CMDin by 11 cycles is outputted as the output command signal CMDout through the output selector 28 and the output circuit 29.

Returning to FIG. 8, a value obtained by adding 1 to the number of elements in an addition formula including the above-described clock cycles means the number of flip-flops required along the transmission path of the latency counter circuit 12, within the range of the latencies 3 to 16. For example, four flip-flops 20 to 23 are used for the latency 11, as described above. As understood from FIG. 8, the number of flip-flops corresponding to the latencies 3 to 16 is five at a maximum. On the other hand, according to the comparison example (configuration of Patent Reference 1) of FIG. 8, the number of flip-flops required along the transmission path is clearly larger than that of the embodiments, within the range of the latencies 3 to 14 (latencies 15 and 16 are not used). In this manner, by employing the latency counter circuit 12 of the embodiments, the number of flip-flops required in the operation can be drastically reduced, and accordingly consumption current in the operation can be reduced.

In the foregoing, the embodiments have been specifically described. However, the invention is not limited to the embodiments and can variously be modified without departing the essentials of the present invention. For example, a range of latencies to be counted and the number of connected flip-flops can be appropriately modified as needed. Further, the invention can be applied not only to the DRAM such as DDR3-DRAM, but also to semiconductor devices of various specifications in which the latencies need to be counted. Furthermore, the semiconductor devices to which the invention can be applied include CPU (Central Processing Unit), MCU (Micro Control Unit), DSP (Digital Signal Processor), ASIC (Application Specific Integrated Circuit), ASSP (Application Specific Standard Product) and the like. The functions achieved by the semiconductor devices of the invention are not limited to the configurations and operations described using the accompanying drawings, and the same functions can be achieved by various configurations and operations.

The invention claimed is:

1. A semiconductor device comprising:
a clock generating circuit capable of generating a first divided clock including a first phase by dividing an input clock by a first division number and a second divided clock including a second phase by dividing the input clock by a second division number, respectively, based on setting information; and
a counter circuit including a shift register which includes a plurality of stages that sequentially shifts an input signal and outputs an output signal delayed based on the setting information,
wherein the counter circuit is capable of individually controlling operation timings of respective stages of the shift register by selectively supplying either of the first and second divided clocks to the stages of the shift register and is capable of extracting either of signals outputted from the stages of the shift register to output it as the output signal, based on the setting information.

2. The semiconductor device according to claim 1, wherein the first and second divided clocks are same in the division number as each other and are different in the phase from each other, for a specific piece of the setting information.

3. The semiconductor device according to claim 2, wherein a plurality of division numbers used in the clock generating circuit include two and four division numbers, each of the first and second divided clocks is a divide-by-two clock within a range of a small delay based on the setting in formation, and each of the first and second divided clocks is a divide-by-four clock within a range of a large delay based on the setting information.

4. The semiconductor device according to claim 3, wherein the divide-by-two clock has one of two phases different from each other by 180 degrees, and the divide-by-four clock has one of four phases different from one another by 90 degrees, respectively, relative to a phase of the input clock.

5. The semiconductor device according to claim 3, wherein the phase of the first divided clock is the same as that of the input clock, and the phase of the second divided clock is different from that of the input clock.

6. The semiconductor device according to claim 1, wherein the counter circuit comprises:
a clock selector selectively supplying either of the first and second divided clocks to a clock terminal of a predetermined one of the stages of the shift register based on a clock control signal; and
an output selector selecting a signal outputted from an output terminal of a predetermined stage of the shift register based on a selection signal, the signal being outputted as the output signal.

7. The semiconductor device according to claim 6, wherein the counter circuit further comprises a decoder generating the clock control signal supplied to the clock selector and generating the selection signal supplied to the output selector.

8. The semiconductor device according to claim 1, wherein the shift register in the counter circuit includes a plurality of flip-flops connected in cascade.

9. The semiconductor device according to claim 8, wherein each of the flip-flops latches the input signal in synchronization with a rising edge of the first or second divided clock.

10. The semiconductor device according to claim 9, wherein, in the plurality of flip-flops, the first divided clock is supplied to clock terminals of flip-flops of first to N-th stages, and the first and second divided clocks are selectively supplied to clock terminals of flip-flops of (N+1)-th to last stages.

11. The semiconductor device according to claim 10, wherein the output signal is selectively extracted from the output terminal of each of the flip-flops of (N+1)-th to last stages.

12. The semiconductor device according to claim 1, wherein the input signal is a command signal.

13. The semiconductor device according to claim 1, wherein the output signal is a signal obtained by delaying a command signal as the input single by a predetermined time based on the setting information.

14. The semiconductor device according to claim 1, wherein the output signal is supplied as a command signal to a peripheral circuit of a memory cell array.

15. A semiconductor device comprising:
a first selecting circuit that selects a clock signal of a plurality of clock signals based on a first control signal;
a first latch circuit including a data input node, a data output node outputting a first data signal, and a clock input node receiving the selected clock signal;
a second latch circuit including a data input node coupled to the output node of the first latch circuit, a data output node outputting a second data signal, and a clock input node receiving the selected clock signal; and
a second selecting circuit that selects an output data signal of a plurality of output data signals including the first and second data signals based on a second control signal.

16. The semiconductor device according to claim 15, wherein each of the plurality of clock signals individual phase.

17. The semiconductor device according to claim 15, further comprising a third latch circuit including a data input node, a data output node coupled to the data input node of the first latch circuit, and a clock input node receiving one of the plurality of clock signals.

* * * * *